United States Patent [19]  [11] 4,369,463
Anastassiou et al.  [45] Jan. 18, 1983

[54] GRAY SCALE IMAGE DATA COMPRESSION WITH CODE WORDS A FUNCTION OF IMAGE HISTORY

[75] Inventors: Dimitris Anastassiou, Croton-on-Hudson; Joan L. Mitchell, Ossining, both of N.Y.

[73] Assignee: International Business Machines Corporation, Armonk, N.Y.

[21] Appl. No.: 270,662

[22] Filed: Jun. 4, 1981

[51] Int. Cl.³ .................. H04N 7/12; H03K 13/22
[52] U.S. Cl. ................... 358/135; 358/138; 358/260; 264/515; 375/31; 375/33
[58] Field of Search ............ 358/135, 138, 133, 260, 358/261, 13; 364/515; 375/27, 28-33

[56] References Cited

U.S. PATENT DOCUMENTS

| | | | |
|---|---|---|---|
| 3,699,566 | 10/1972 | Schindler | 375/32 |
| 3,825,832 | 7/1974 | Frei | 358/135 |
| 4,005,411 | 1/1977 | Morrin | 375/31 |
| 4,075,655 | 2/1978 | Iijima | 358/13 |

*Primary Examiner*—Howard Britton
*Attorney, Agent, or Firm*—Roy R. Schlemmer, Jr.

[57] ABSTRACT

The present invention relates to a method and apparatus for compacting gray-scale image data which maintains extremely good picture quality and can result in typical images in a compression ratio of 5 to 1 and even better if a final step of arithmetic coding is used. The method is a special application of adaptive differential pulse code modulation (DPCM) which utilizes a prediction of smoothness surrounding a current pel to determine variable length codes to convey the quantized error. Thus, a continuously adaptive variable length code is produced which may be accurately decoded without using any further marker (code indicator) bits. For each pel and "error bit" is generated to indicate to the decoder if the predicted quantization range is adequate. These eroror bits can be further significantly compressed.

This method permits the use of a "zero bit" per pel mode for the data transmission (1 "error bit" per pel actually transmitted) and provides for the automatic detection of the particular variable length compression code utilized for transmitting the quantized error ($E_Y$) for a particular pel. Utilizing the concepts of the present invention the inventors have obtained compression rates of approximately 1.5 bits per pel that produce a gray scale image at the decoding end of such a data transmission or storage system which has excellent quality (equal to 5 bit DPCM).

By adding the concept of arithmetic coding to the previously set forth method, due to the nature of the statistical distribution of said special purpose error bit patterns, a compressed data set of less than 1 bit per pel has been achieved. This was produced from an original 8 bit per pel gray scale image.

21 Claims, 11 Drawing Figures

FIG. 1

HISTORY LINE

CURRENT LINE

FIG. 2
PRIOR ART
2 BIT DPCM

FIG. 3

| QUANTIZATION LEVEL | QUANTIZED ERROR E VALUE | TYPICAL QUANTIZATION CHARACTERISTICS |
|---|---|---|
| 255 | | |
| PRED + $Q_n$ | n | +N |
| PRED + $Q_4$ | 4 | +17 |
| PRED + $Q_3$ | 3 | +10 |
| PRED + $Q_2$ | 2 | +5 |
| PRED + $Q_1$ | 1 | +2 |
| PRED | 0 | 0 |
| PRED − $Q_1$ | −1 | −2 |
| PRED − $Q_2$ | −2 | −5 |
| PRED − $Q_3$ | −3 | −10 |
| PRED − $Q_4$ | −4 | −17 |
| PRED − $Q_n$ | −n | −N |
| 0 | | |

FIG. 4
ENCODER

FIG. 5
COMPRESSOR

FIG. 6
ENCODER LOGIC

FIG. 7
DECODER

FIG. 8
DECOMPRESSOR

FIG. 9
DECODER LOGIC

GRAY SCALE IMAGE DATA COMPRESSION WITH CODE WORDS A FUNCTION OF IMAGE HISTORY

BACKGROUND OF THE INVENTION

The present invention relates to improvements for generating a minimum length code word stream for efficient transmission or storage of two dimensional gray scale image data utilizing the concepts of adaptive differential pulse code modulation.

Gray scale images are stored as rectangular arrays of numbers corresponding to the intensity values at each picture element (pel). Usually, each intensity value is given by a byte (8 bits). This allows 256 possible values which are enough for excellent image representation if the sampling is sufficiently dense.

Coding for data compression is needed to reduce the length of the bit-stream representing the image in cases of limited storage or transmission capacity. The compression ratio can be greatly increased if one allows "lossy compression", i.e., if the image that the decoder reconstructs from the received bit-stream is not identical to the original one. For most practical purposes, such a distortion is allowed if it can barely be detected by an observer. A complicated trade-off exists between the achievable compression, the complexity of the coding algorithm, and the distortion between the original and reconstructed images.

Most algorithms known in the art for gray scale compression are forms of either Transform coding or Differential Pulse Code Modulation (DPCM). For large compression ratios, DPCM is considered to give a worse quality of reproduced image but is less complex than Transform Coding. The reason for the inferior quality of DPCM is mainly that each pel is encoded using the same number of bits (which cannot be less than 1), while images contain some segments in smooth areas that need less than 1 bit/pel for adequate coding.

Figure 1:
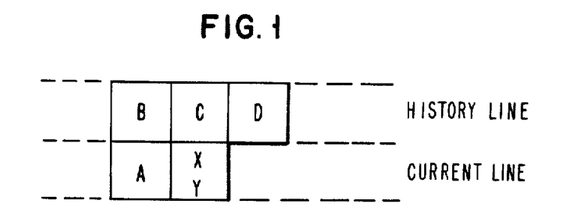
FIG. 1 is an illustrative diagram showing the relevant pel locations in a typical image data processing system specifically illustrating the (history) pels surrounding a current pel being evaluated.

In conventional DPCM schemes the image is encoded recursively, in raster scan order, usually from left to right. Thus, when the "current pel" is encoded, all pels of the previous scan lines, as well as all pels to the left of the current pel in the same scan line, have been encoded; this means that the decoder, when reaching the location of the current pel, will have access to all intensity values of the reconstructed image at these history pels. In FIG. 1, four of these locations are shown. The values A, B, C and D are used to denote the reconstructed intensity values (different from the actual ones which are unknown to the decoder). The actual intensity value of the current pel is denoted by X, while the reconstructed one is denoted by Y. The upper or lower-case subscripts a b, c and d will be used to imply the locations of history pels with reconstructed intensity values A, B, C, D respectively, while the upper-case subscript X will imply the location of the current pel.

A fixed number, K, of bits is used to encode the value of the current pel by quantizing it into one of $2^K$ possible quantization levels centered around a predicted value. A typical simple choice for the predictor (PRED) is:

$$PRED = A + (C-B)/2 \qquad (1)$$

Figure 2:
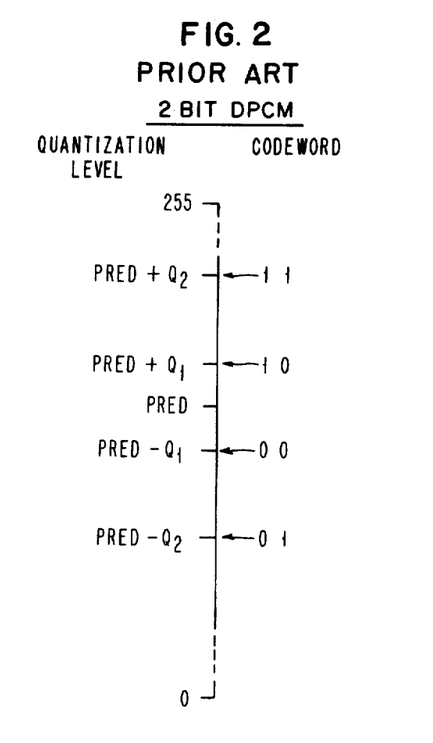
FIG. 2 diagrammatically illustrates a prior art two bit DPCM coding system.

A DPCM algorithm of, say, 2 bits/pel will encode the value X into the quantized one Y which will be the one among $PRED - Q_2$, $PRED - Q_1$, $PRED + Q_1$, $PRED + Q_2$ which is closest to X. The quantities $Q_1$ and $Q_2$ are known and specify the quantization characteristics. (See FIG. 2).

A set of quantization characteristics around the predicted value which gives excellent quality encoding using a 5 bit DPCM system for an original 8 bit/pixel image is 0, 2, 5, 8, 13, 20, 27, 36, 47, 59, 72, 86, 100, 116 and 128 (with one sign bit and 4 magnitude bits) as reported by Sharma, D. K. and Netravali, A. N. (1977) IEEE Trans. Commun. Com-25, 1267–1274. These values should be considered as illustrative only. If the whole range of 256 gray levels is used and they are normalized according to the human visual system discriminatory capability they could be arranged on a coarser scale. These particular values are based on psychophysical experiments.

Many extensions of DPCM schemes have been proposed in which the predictor and/or quantizer are adaptive to the local characteristics of the image (based on information from the image history, which must, of course, be known to the decoder). The justification for using an adaptive approach is that in areas that are not smooth, nonlinear predictors work better than simple ones like Eq. (1); also the discriminatory capability of the visual system is reduced in non-smooth areas allowing *a coarser* quantization than one which is suitable for smooth areas. These adaptive schemes require at least 4 bits/pel (the 8 quantization levels per pel that 3 bits would provide are insufficient) for an excellent quality coding.

DESCRIPTION OF THE PRIOR ART

U.S. Pat. No. 3,825,832 of Frei, et al issued July 23, 1974, describes apparatus for switching between delta modulation and DPCM for gray scale source encoding. Frei monitors outputs such that for constant tone the delta modulator replaces DPCM and for near infinite slope, DPCM replaces delta modulation. The significance is the fact that a special character indicative of the modulation switching must be embedded in the code-stream. The facsimile data transmission arts contain many examples of altering the magnitude resolution as a function of a pre-determined encoder output response generally indicative of an abrupt slope change.

U.S. Pat. No. 3,699,566 of Shindler, discloses changing magnitude resolution at different time rates of change as a function of delta modulation encoder output.

Jones, et al, IBM Technical Disclosure Bulletin, March 1973, pages 3168–3169, alters the spatial resolution by changing the sample frequency as a function of a previously encoded delta modulation output bit.

Examples of using picture history or information extracted from previously scanned (and encoded) pels that control or influence encoder/decoder response are disclosed in U.S. Pat. No. 4,075,655 of Iikima et al issued Feb. 21, 1978, and U.S. Pat. No. 4,141,034 of Netravali issued Feb. 20, 1979. Both of these references use a two-dimensional cluster of source code values as a predictor in the narrow band encoding of color TV chrominance.

Tescher, in an article entitled "Image Coding: Variable Rate Differential Pulse Code Modulation Through Fixed Rate Channel" in the Proceedings of the SPIE Vol. 119, Application of Digital Image Processing (IOCC 1977), on page 147 discloses a block adaptive DPCM procedure combined with a buffer feedback technique to vary the length of the DPCM code transmitted. Stated very generally, Tescher pre-analyzes each block to determine the code length for adequate quality. He continually analyzes the filling of buffers and generates feedback signals which will cause a shorter DPCM code to be utilized as the buffers begin to fill to an unacceptable level. The system of Tescher uses special marker bits preceding each block of code to indicate just what DPCM code length is being currently used for that block.

German Pat. No. P2740945.6 of A. C. Mussmann and also his article on the same subject entitled "Predictive Image Coding" in the book "Image Transmission Techniques" edited by W. Pratt belonging to the series "Advances in Electronics and Electron Physics" Supplement 12, published by Academic Press, New York 1979, discloses an adaptive DPCM System for compression encoding of gray scale facsimile image data which utilizes a constant 4 bit per pel DPCM code for compressing and transmitting a normal 8 bit/pel original code. Mussmann utilizes a first step of pel prediction based on previously transmitted surrounding pel data and DPCM encodes a particular pel utilizing a particular quantization characteristic. He periodically makes a "smoothness" determination based on the magnitude of previously transmitted quantization error (DPCM) codes and changes the quantization characteristic depending on the smoothness or coarseness of the surrounding picture area. In each case the actual number of bits, i.e., 4, remains the same. However, the mapping of these bits to a particular quantization characteristic will vary in accordance with the smoothness predictor. He thus does not disclose the use of a variable rate DPCM code and always achieves a compression ratio of exactly 2:1.

SUMMARY OF THE INVENTION

It is a primary object of the present invention to provide a method and apparatus for generating a minimum length code word stream representative of a two-dimensional gray scale image data stream.

It is a further object to provide such a method and apparatus wherein an excellent compression ratio is achieved while, at the same time, maintaining an excellent picture quality subsequent to decoding.

It is yet another object of the invention to disclose such a method utilizing arithmetic coding techniques together with other coding approaches to achieve compaction ratios of less than 1 bit per pel from an original gray scale code of 8 bits per pel.

The foregoing and other objects, features and advantages of the invention are accomplished, in general, by utilizing a continuously adaptive DPCM coding technique together with a method for predicting the variable length codes which will be required to transmit a quantized error signal and utilizing appropriate controls for both the encoding and decoding operations to properly encode and decode said quantized error into and from the particular variable length code indicated.

More specifically, the method utilizes an indication of smoothness surrounding a current pel to determine which variable length codes which should be adequate to convey the quantized error. Thus, a continuously adaptive, variable length code is produced which may be accurately decoded without using any further marker bits. One special purpose bit, called the "error bit" is always generated which indicates whether or not the codes for transmission of the quantized error signal indicated by the "smoothness" determination are sufficient for accurate encoding. This method permits the use of a "zero bit" per pel mode for transmitting said quantized error signal and provides for the automatic detection, during the decoding operation, of the particular variable length compaction code utilized for transmitting same.

More particularly, the present encoding (and decoding) method for compacting gray scale image data comprises the steps of: (1) predicting the gray scale value of a pel which is to be transmitted utilizing the values previously transmitted for certain adjacent pels; (2) predicting the codes which should suffice for transmitting the quantized error for correcting the predicted pel value to approximately the true value of the current pel utilizing a predetermined quantization characteristic; (3) determining the code which is actually needed to transmit the quantized error; (4) producing a first special purpose code bit when such predicted codes for transmitting the quantized error are sufficient and a different bit when they are insufficient; and (5) generating the proper variable length code for indicating said quantized error.

According to an additional aspect of the invention, it may be determined that no quantized error signal is necessary wherein said first special purpose code bit is generated in response thereto and wherein no quantized error signal is produced.

According to a still further aspect of the invention further significant compression is possible by applying the step of arithmetic coding to the coding sequence set forth above due to the large redundancy of the patterns produced by said special purpose error bit generation.

DESCRIPTION OF THE PREFERRED EMBODIMENT

As described previously, the present invention is an extension of prior adaptive DCPM compression coding techniques.

The presently disclosed coding mechanism utilizes the underlying concepts of DPCM coding and, in effect, superimposes upon these concepts a further adaptive compression technique which gives the compression performance of a 5 bit DPCM system utilizing the concept of a special purpose bit referred to subsequently, as an "error bit". As will be explained subsequently, for each pel a special purpose bit is generated and depending upon the data history in the region of said pel an additional variable length quantized error code will be produced if necessary. If all of the special purpose or error bits for a particular image are considered as a totality, referred to herein as an "error bit image", the statistical nature of this error bit image readily lends itself to significant further compression utilizing the concepts of arithmetic coding as will be explained subsequently.

Thus, the essence of the present invention is a recognition of the fact that making the codes sent for each pel adaptive can significantly increase compression. It is, of course, obvious that it is necessary to develop a mechanism whereby both the encoding and decoding operations utilize the same codes for the encoding and decoding processes.

It is well known in the art, that smooth areas of an image, i.e., when the gray scale values differ very slightly from pel to pel, need less quantization levels than areas near edges. However, using fewer quantization levels for a pel, if its coded history is smooth, cannot guarantee excellent quality since an unpredictable jump of the intensity level is always a possibility. The previously referenced article by Tescher has used block coding with look ahead, in which the information of the number of bits per pel, used for each block, is sent in advance to the decoder. It is desirable, however, to avoid separating the image into blocks requiring look ahead for the encoder. A pel-by-pel adaptive approach as utilized in the present method has significantly better performance in addition to being simpler.

Figure 3:
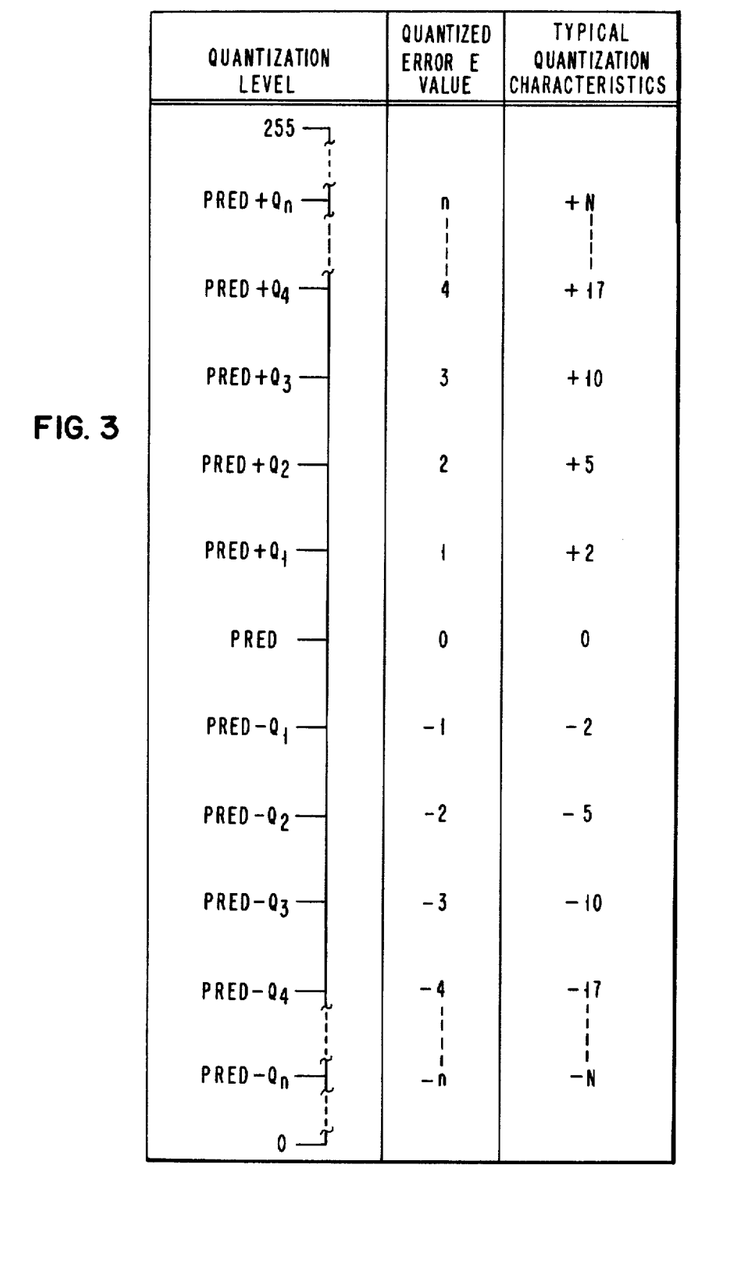
FIG. 3 is a diagram similar to FIG. 2 illustrating an extended quantization characteristic and the relevant quantized error indicator (E) associated therewith.

In order to do this, a quantity is defined which gives the degree of smoothness for each pixel. In FIG. 3 the general notation for a set of quantization characteristics is shown. The quantized error indicator E (the quantized error measured in allowed integer quantization steps) specifies completely the chosen quantization level once the quantization characteristic (Q's) is given. Note that E, for all previously coded pels would be known to the decoder (as well as the encoder). One more quantity being used to specify the coding rules for the current pel is now defined:

Before proceeding further with the description it should be understood that the following terminology and conventions are used. The value of PRED is computed utilizing the formula:

$$PRED = A + (C - B)/2$$

This is the same formula for arriving at the value of PRED described previously in the Background of the Invention section. It should be clearly understood that this particular value could be arrived at by utilizing a number of different possible prediction algorithms. However, this particular one has been found to give good results although it is not to be construed as in any way limiting on the present invention. For the evaluation of a particular pel X and the meaning of the values A, B, and C, FIG. 1, should be referred to (as well as PEL location D). The value of the quanitized error $E_Y$ for a given pel location as utilized in the computation of $E_{max}$ requires the quantized errors $E_A$, $E_B$, $E_C$ and $E_D$, which were generated respectively for the pel locations, A, B, C, and D. It is noted in this latter regard that the quantized error $E_X$ is not specifically generated as the value X is known only at the encoding station. Since it is not used for computational purposes it is never generated at the encoding stations or sent to the decoding station. The quantized error $E_Y$ for the quantized value Y at pel location X is known to the Decoder.

$$E_{max} = \max (|E_a|, |E_b|, |E_c|, |E_d|)$$

Where: $|E_x|$ is the absolute value (regardless of sign) of the quantized error derived for the pel at location X, this value $E_{max}$ indicates the predictability of the local area around the current pel.

It turns out that the predictable areas are the smooth ones, therefore, $E_{max}$ is also a smoothness indicator. The previously discussed article by Mussmann, first used the above equation as a function adaptively determining the values of the quantization levels using a constant bit rate of 4 bits/pel. The present method uses $E_{max}$ as an indicator to shift to various modes of operation and it shows that sufficiently dense quantization levels can be used together with the predictor function described previously in the Background Art section for predicting the value of pel X, at an encoding rate which is image dependent but usually of the order of 1-1.5 bits/pel instead of 5 bits/pel. The bit rate transmitted will be variable (asynchronous) for each pel.

The smoothness indicator $E_{max}$ is used to predict the quantization range. For simplicity in the preferred embodiment each allowed range encodes the enclosed Q levels with a constant code length. Thus, the number of bits (referred to later as the mode) can be used to identify each range. For example, the 2 bits per pel mode includes $-Q_2$, $-Q_1$, $+Q_1$, and $+Q_2$ in the predicted range. If the actual Q is outside the allowed range as determined by $E_{max}$, the preferred embodiment constructs the code for $E_y$ by a "sign bit" followed by a code for the number of quantization steps that $E_y$ is *beyond* the allowed steps.

The preferred embodiment keeps the Q values constant, but they could be allowed to vary as a function of the encoded history pels.

Any compression scheme can be used with guaranteed quality provided that those pels that have not been encoded with acceptable accuracy are identified and their value is corrected. The locations of those badly coded pels can be defined using an error map, which essentially is a black and white image of the same size as the original image, containing a '0' for the accurately coded pels and a '1' for the remaining ones. If the number of 0's is small compared to the number of 1's (or vice versa) then this "error bit image" can be further compressed due to its redundancy. For a DPCM scheme it is preferable to identify those locations in which the error bit is '1' at the time it is coded so that the correction occurs at that time and the correct value is used to evaluate the indicators PRED and $E_{max}$ for future pels. It is also possible to multiplex the compressed error bit image with segments of compressed gray scale image, so that the location of errors is known to the decoder before it decodes sections.

In the disclosed method, the value of $E_{max}$ determines a range of quantization levels around PRED so that if the actual intensity value is within this range, a small number of bits (including the possibility of 0 bits) is required for encoding; otherwise additional correction bits must be used. The information of whether or not the range is sufficient is given by the bit error image which, as explained above, contains a bit for every pel location: a '0' if the range found from $E_{max}$ is sufficient and '1' otherwise. If the error bit image is sent uncompressed then this bit can always be the first bit sent for each pel. For additional compression, as will be explained subsequently, the error bit image may be sent in compressed form.

There are four cases, translatable into MODES, shown in the following table:

TABLE I

| Case | $E_{max}$ | MODE bits/pixel (excluding error bit) | Quantization levels allowed by bits in Mode | Error bit = 0 if \|X-PRED\| is not greater than |
|------|-----------|---------------------------------------|---------------------------------------------|-----------------------------------------------|
| I    | >3        | 3                                     | $-Q_4, -Q_3, -Q_2, \ldots, Q_4$             | $(Q_4+Q_5)/2$                                 |
| II   | 3         | 2                                     | $-Q_2, -Q_1, Q_1, Q_2$                      | $(Q_2+Q_3)/2$                                 |
| III  | 2         | 1                                     | $-Q_1, Q_1$                                 | $(Q_1+Q_2)/2$                                 |
| IV   | 0,1       | 0                                     | 0 (Y=PRED)                                  | THR                                           |

For example, if $E_{max}=3$, then 2 bits are used to specify Y as one of $PRED-Q_2$, $PRED-Q_1$, $PRED+Q_1$, $PRED+Q_2$ provided that $|X-PRED| <= (Q_2+Q_3)/2$; in this case the error bit is '0' raising the total number of bits used to 3. If $|X-PRED| > (Q_2+Q_3)/2$ then the error bit is 1 and a correction codeword (to be explained shortly) is used instead to designate the appropriate level.

If $E_{max}<2$ then no bit is used (other than the '0' of the error image) if $|X-PRED| <= THR$ where THR is a constant threshold. In this case we set Y=PRED and Ey=0. If $|X-PRED| > THR$ then the error bit is '1' and a correction codeword is sent.

The situation where no quantized error is expected (mode=0) is the most important contribution of the present invention. It can result in a coding rate of less than 1 bit/pel if there are smooth areas in the coded image, provided that the error bit image is also compressed. This approach solves the main problem of DPCM compared to Transform Coding at high compression ratios, namely that DPCM is unable to spent less than 1 bit/pel even for pels that belong to large smooth very redundant areas.

TABLE II

| Quantization Levels | MODE $E_{max}$ | 0 0,1 | 1 2 | 2 3 | 3 >3 |
|---------------------|----------------|-------|-----|-----|------|
|                     | $E_y$          |       |     |     |      |
| PRED+QN             | +N             | *     | *   | *   | *    |
| .                   | .              |       |     |     |      |
| .                   | .              |       |     |     |      |
| PRED+Q5             | +5             | *     | *   | *   | *    |
| PRED+Q4             | +4             | *     | *   | *   | 111  |
| PRED+Q3             | +3             | *     | *   | *   | 110  |
| PRED+Q2             | +2             | *     | *   | 11  | 101  |
| PRED+Q1             | +1             | *     | 1   | 10  | 100  |
| PRED                | 0              | (implicit) | — | — | — |
| PRED-Q1             | -1             | *     | 0   | 00  | 000  |
| PRED-Q2             | -2             | *     | *   | 01  | 001  |
| PRED-Q3             | -3             | *     | *   | *   | 010  |
| PRED-Q4             | -4             | *     | *   | *   | 011  |
| PRED-Q5             | -5             | *     | *   | *   | *    |
| .                   | .              |       |     |     |      |
| .                   | .              |       |     |     |      |

TABLE II-continued

| Quantization Levels | MODE $E_{max}$ | 0 0,1 | 1 2 | 2 3 | 3 >3 |
|---------------------|----------------|-------|-----|-----|------|
| PRED-QN             | -N             | *     | *   | *   | *    |

*Outside allowed range
—not used

If the error bit is '1' then the correction codewords in all cases consist first of a direction or sign bit (being '1' if X>PRED and '0' otherwise). Then there are a number of 0's followed by a 1. The total number of bits sent depends on the value of $E_x$. An example in the case where $E_{max}=3$ (case II) is shown in Table III.

The quantization levels $PRED+Q_2$, $PRED+Q_1$, $PRED-Q_1$, and $PRED-Q_2$ are not listed in Table III because they follow an error bit of '0' for $E_{max}=3$.

TABLE III

| LEVEL    | CODEWORD | $E_y$ |
|----------|----------|-------|
| . . .    | . . .    |       |
| PRED+Q6  | 10001    | 6     |
| PRED+Q5  | 1001     | 5     |
| PRED+Q4  | 101      | 4     |
| PRED+Q3  | 11       | 3     |
| PRED-Q3  | 01       | -3    |
| PRED-Q4  | 001      | -4    |
| PRED-Q5  | 0001     | -5    |
| PRED-Q6  | 00001    | -6    |
| . . .    | . . .    |       |

This code scheme was selected for its simplicity although other schemes may give better compression.

Additional improvement of the performance of the algorithm can be achieved if the error bit image is sent in compressed form so that its contribution becomes less than 1 bit/pel. The redundancy of the error bit image lies mainly in the skewed proportion of its total number of 0's and 1's. Fixed Huffman coding schemes based on run length coding with or without vertical reference do not work well on the error bit image. Their run length code tables do not correspond to the statistics of the error bit image. The error bit image can also have very different statistics for each gray scale image and so is not suited to fixed codes.

This problem is solved using adaptive Arithmetic Coding which is very powerful compression technique that was developed in theoretical form by J. Rissanen and G. G. Langdon, in the article "Arithmetic Coding" in IBM J. Res. Dev. 23, 149 (1979). They apply it to binary images in the article "Compression of Black-White Images with Binary Arithmetic Coding" in IBM Research Report No RJ2707 available from the IBM Research Center Library in Yorktown Heights, N.Y.

How Arithmetic Coding works will not be described here. At this point, the dependence of its performance on the statistical nature of the entity to be encoded will be explained. Arithmetic Coding essentially separates the coding problem into two independent parts:

1. Finding a good statistical model for the entity to be encoded.
2. Performing the coding based on that model with optimum performance.

Arithmetic Coding encodes each symbol sequentially and both encoder and decoder have the encoded history available. Before encoding the current symbol, a probability must be assigned to each possible outcome; these probabilities depend on information that must also be known to the decoder. In other words, a statistical model for calculating probabilities must be preassigned.

For example, in the case of the error bit coding, the probability of a bit being a 0 or 1 can be given by the relative proportion of the already encountered 0's and 1's in the error bit image. A more complicated rule can be to look at the configuration of (already coded) bits at some close past m locations. There are 2**m possible such states (configurations). One can calculate the probability using the relative proportion of the encountered 0's and 13 s only when the state was identical to the one that the current bit has; or one can use different statistics for each mode (number of bits/pel used in each pel). Also, the collected statistics can be made more dependent on the close history than on the remote one in order to account for nonstationarities.

The above completes a description of the underlying concepts of the present invention. It will be noted in summary that the present image data compression method involves two prediction operations. The first prediction produces the actual predicted magnitude of the gray scale value PRED and the second produces a signal which indicates the history pels smoothness and which determines the codes required to carry the quantized error ($E_Y$) which codes should suffice to convey the actual quantized error step ($E_Y$) which must be used to give satisfactory results. When the predicted range of the quantized error is insufficient, a special purpose bit referred to as the "error bit" herein advises the system for any subsequent decoding operations that said predicted range was insufficient, which will automatically indicate that a different code is being utilized to transmit the quantized error $E_Y$. It should be clearly understood by referring to Tables II and III set forth previously, that when the error bit is a "1" a first compression code is utilized as set forth in Table II and that when the error bit is "0" a different compression code must be utilized, such as set forth in Table III.

A significant feature of this concept, however, is that when the predicted range for E is 0 and this value is found to be sufficient, only a single bit, the error bit, needs to be generated for the particular pel being evaluated. As will be appreciated, the special purpose or error bit is the only bit which is generated in a very high percentage of the cases where the image is very smooth.

It should also be clearly understood that while particular formulas for PRED, $E_{max}$, and the determination of mode have been set forth herein, they could be varied by those skilled in the art to adjust the system for different types of images where greater compression might be obtained through a change of certain of these system equations. Similarly, the two codes illustrated in Tables II and III for generating the value of $E_Y$ could be altered by those skilled in the art without departing from the spirit and scope of the invention. The essential feature is that they are fixed for a given value of MODE. Upon decoding the system automatically determines the precise MODE and thus the code being used for any given pel's Ey. The particular code being used is dependent upon the state of the "error bit".

Referring to FIGS. 4–11 there will now follow a description of a preferred hardware embodiment of a data compression system constructed in accordance with the teachings of the present invention.

Figure 4:
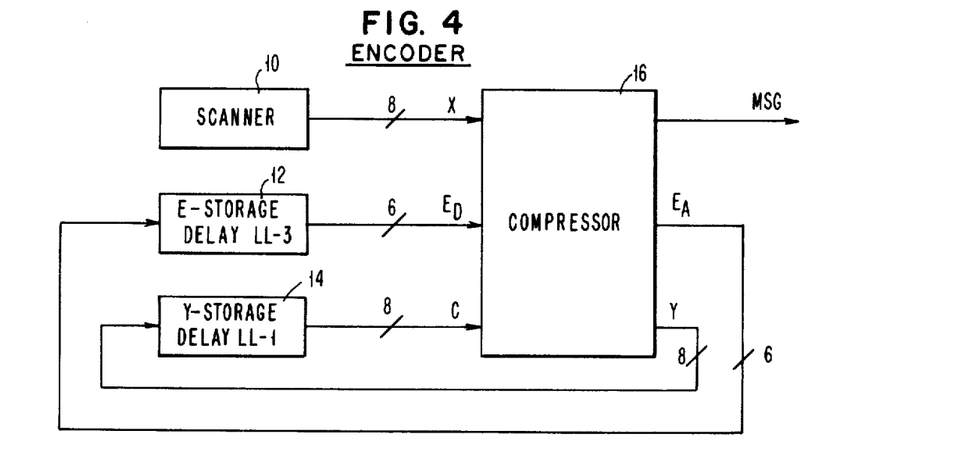
FIG. 4 comprises an overall functional block diagram of a suitable encoder for use with the present invention.

Referring first to FIG. 4 a functional block diagram of an encoder constructed in accordance with the teachings of the present invention is disclosed in functional form. The Encoder comprises a Scanner 10 which may be considered to be any source of a serial stream of gray scale values (usually 8 bits) representing an image which is to be encoded. Depending upon the application, the gray scale signal stream denoted by X could alternatively be obtained from a suitable storage device or the like. The two storage devices 12 and 14 are utilized for storing the pel history data necessary for the two prediction operations. Storage device 12 sequentially receives the quantized error steps E which, through appropriate delay within the storage means 12 become the history value $E_C$ and $E_B$ come from delay in compressor. Similarly, storage element 14 is utilized for storing the series of pel values Y which will be generated during the decoding operation but which must also be generated during the encoding process in order to properly compute each successive value of PRED as was explained previously.

Both of the storage units 12 and 14 are essentially shift registers which will produce a new value of $E_D$ and C respectively each time a new pel is being evaluated and then the registers are shifted by one pel storage position.

The delays in these storage units are slightly less than a raster scan line length (LL). The $E_D$ value is needed LL-3 shifts later. The Y value is required LL-1 shifts later.

Compressor 16 contains the logic necessary for forming the two predictions and for producing the proper error bit and quantized error $E_Y$ (when needed) which forms the message MSG. In addition, Compressor 16 outputs the values $E_A$ and Y and returns them to the storage units 12 and 14 respectively for use during the processing of subsequent pels. It will be further noted in the figure that the values of X and Y are represented by 8 bits and the values for the quantized errors $E_A$, $E_B$, $E_C$ and $E_D$ are represented by 6 bits. The 8 bits correspond to the original and reconstructed gray scale values which are defined to be 8 bits. The 6 bits is essentially optional, however, it was found that for this particular embodiment 6 bits was sufficient to carry the maximum quantized error anticipated. A larger or lesser number of bits could obviously be provided depending upon the embodiment.

Figure 5:
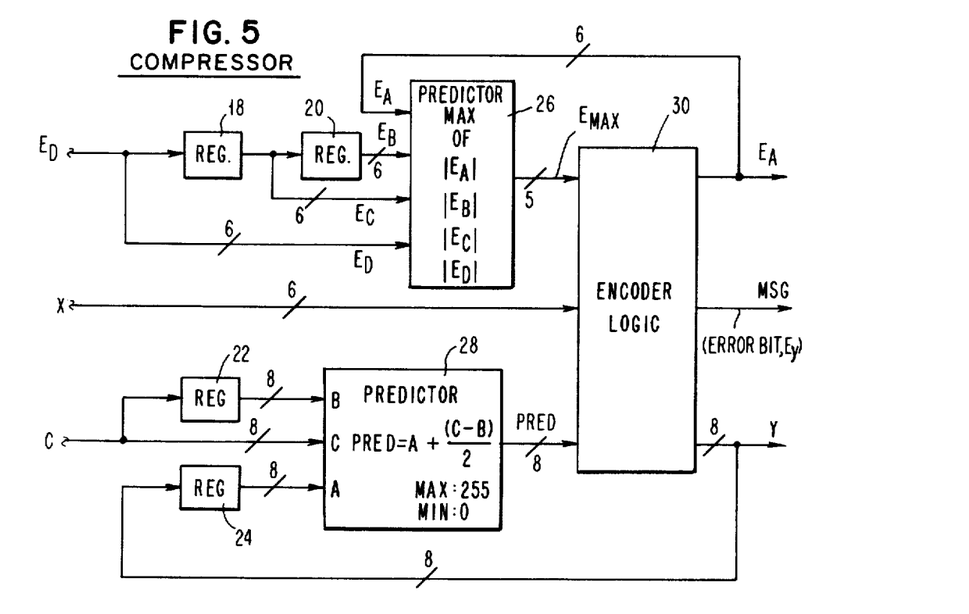
FIG. 5 is a functional block diagram of the Compressor shown in FIG. 4.

Referring now to FIG. 5, a functional block diagram of the Compressor 16, of FIG. 4 is shown. It should first be noted that the three inputs at the left hand portion of the FIG. 5 $E_D$, X, and C are the same as those entering the Compressor in FIG. 4 and similarly the outputs MSG, $E_A$, and Y are the outputs from said Compressor. The two registers, 18 and 20 are essentially extensions of the E storage unit 12 shown on FIG. 4 and in effect, delay value $E_D$ two pel positions to produce the values $E_B$, $E_C$ as shown. Alternatively, these two registers could have been incorporated within the storage unit 12 and the three outputs $E_B$, $E_C$, and $E_D$ could have been taken directly from the storage unit 12. The other quantized error input $E_A$ is taken directly from the output of the compressor and fed back, it being noted that value $E_Y$ for a current pel becomes the value $E_A$ for the next pel.

Registers 22 and 24 serve the same purpose as the registers 18 and 20 in that they produce the required history values A and B, necessary for the computation of PRED. The two Predictors 26 and 28 perform the functions indicated within the block. These units are small, limited purpose micro-processors which operate under control of a small read-only memory to produce the functions indicated. This operation is necessary to perform these rudimentary logic operations which are considered obvious to one skilled in the art and are not specifically set forth. The output of the two Predictors 26 and 28 are the values $E_{max}$ and PRED described previously.

Block 30, entitled Encoder Logic performs a logical evaluation utilizing the values of X, the pel to be encoded, $E_{max}$, and PRED which is the DPCM starting value which may or may not require additional quantization steps to produce the value Y which will be regenerated subsequently during the decoding operation.

Figure 6:
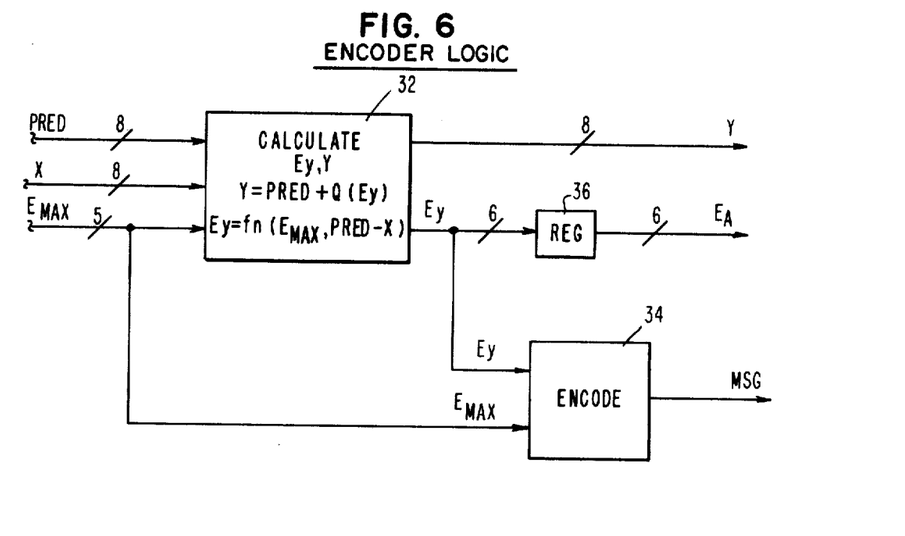
FIG. 6 is a functional block diagram of the Encoder Logic block of the Compressor of FIG. 5.

The Encoder Logic Block 30 which is shown in detail in FIG. 6, utilizing the values $E_{max}$, X, and PRED must first determine the MODE from $E_{max}$, and then determine if the number of bits specified by the MODE determination is sufficient for encoding the error quantization value Q via the quantized error $E_Y$ allowed by the mode determination. If it is determined to be sufficient, the proper error bit is produced and the appropriate value of $E_Y$ produced via the code table shown in Table II. If it is not sufficient, a different error bits i.e. 0 is produced and the required quantized error $E_Y$ is produced using a code similar to the example given in Table III. The way this is done is shown in greater detail in the functional block diagram of FIG. 6.

As in FIG. 5, the data entering the Encoder Logic block and the data leaving the block are identical to that shown on FIG. 5. The way that the specific computations are broken down is shown functionally as being performed in the two blocks 32 and 34. Blocks 32 and 34 are essentially small micro-processors similar to 26 and 28. Block 32 calculates the values $E_Y$ and Y. To do this, in effect, it looks at the value computed for PRED relative to the value X. It then selects the quantization characteristic which produces the value of Y most closely approximating X. Having selected the quantization characteristic which produces a value of Y closest to X it produces the value for $E_Y$ which will point to the desired quantization value. A typical micro-program stated functionally for operating block 32 is shown below in Table IV. The program statements and operation are believed to be self-explanatory.

TABLE IV

Determination of Ey

IF
    $E_{max} < 2$
    and
    | X−PRED | < THR
THEN
    $E_Y = 0$
ELSE

| greater than | X−PRED but not greater than | Ey |
|---|---|---|
| $\frac{-Q_n + Q_{n+1}}{2}$ | $\frac{-Q_n + Q_{n-1}}{2}$ | −n |
| . | . | . |
| . | . | . |
| . | . | . |
| $\frac{-Q_2 + Q_3}{2}$ | $\frac{-Q_2 + Q_1}{2}$ | −2 |
| $\frac{-Q_1 + Q_2}{2}$ | 0 | −1 |
| 0 | $\frac{Q_1 + Q_2}{2}$ | 1 |
| $\frac{Q_1 + Q_2}{2}$ | $\frac{Q_2 + Q_3}{2}$ | 2 |
| . | . | . |
| . | . | . |
| . | . | . |

TABLE IV-continued

| $\frac{Q_n + Q_{n-1}}{2}$ | $\frac{Q + Q_{n+1}}{2}$ | +n |
|---|---|---|

| Determination of Qy from Ey | |
|---|---|
| Ey | Q(Ey) |
| 0 | 0 |
| ±1 | ±2 |
| ±2 | ±5 |
| ±3 | ±8 |
| ±4 | ±13 |
| ±5 | ±20 |
| ±6 | ±27 |
| ±7 | ±36 |
| ±8 | ±47 |
| ±9 | ±59 |
| ±10 | ±72 |
| ±11 | ±86 |
| ±12 | ±100 |

*Note if $E_Y$ is <0 then Q is <0.

Block 34 labeled Encode, utilizing the value of $E_{max}$ determines the predicted MODE and then determines if the number of bits allowed for this particular MODE are sufficient to encode $E_Y$. If sufficient, an error bit of "1" is produced and $E_Y$ is encoded utilizing for example, the values in Table II, if in fact, $E_Y$ must be encoded. If, on the other hand, the number of bits allowed by the MODE determination are insufficient, an error bit of 0 is produced and the particular value for $E_Y$ is encoded, utilizing, for example, such codes as shown in Table III. The actual code assignment in either case, may be performed by a table look-up mechanism utilizing a small storage element or may be generated by very simple logic circuitry.

Table V comprises a list of micro instructions which would be stored in a suitable read-only memory within the Encode block 34 for performing the various operations required thereof. As with block 32, the operation of such a small microprocessor operated under the control of a read-only memory, is considered well known in the art and it is not discussed in greater detail.

TABLE V

CODES FOR EACH MODE
MODE = 0 ($E_{max} < 2$)

| Ey | Error Bit | Sign Bit | Rest of Code |
|---|---|---|---|
| −n | 1 | 0 | 0000 . . 01 |
|  |  |  | n |
| . | 1 | 0 | . |
| . | 1 | 0 | . |
| . | 1 | 0 | . |
| . | 1 | 0 | . |
| −3 | 1 | 0 | 001 |
| −2 | 1 | 0 | 01 |
| −1 | 1 | 0 | 1 |
| 0 | 0 |  |  |
| 1 | 1 | 1 | 1 |
| 2 | 1 | 1 | 01 |
| 3 | 1 | 1 | 001 |
| . | 1 | 1 | . |
| . | 1 | 1 | . |
| . | 1 | 1 | . |
| . | 1 | 1 | . |
| n | 1 | 1 | 0000 . . 01 |
|  |  |  | n |

Note that the 1.0.01 code stands for:
−2 when in MODE=0,
−3 when in MODE=1,
−4 when in MODE=2, and
−6 when in MODE=3.

MODE = 1 ($E_{max} = 2$)

| Error | Sign | Rest of |

TABLE V-continued

| $E_Y$ | Bit | Bit | Code |
|---|---|---|---|
| −n | 1 | 0 | 0000..01 |
|  |  |  | n−1 |
| . | 1 | 0 | . |
| . | 1 | 0 | . |
| . | 1 | 0 | . |
| . | 1 | 0 | . |
| −4 | 1 | 0 | 001 |
| −3 | 1 | 0 | 01 |
| −2 | 1 | 0 | 1 |
| −1 | 0 | 0 | 0 |
| 0 | — | — | — |
| 1 | 1 | 1 |  |
| 2 | 1 | 1 | 1 |
| 3 | 1 | 1 | 01 |
| 4 | 1 | 1 | 001 |
| . | 1 | 1 | . |
| . | 1 | 1 | . |
| . | 1 | 1 | . |
| . | 1 | 1 | . |
| n | 1 | 1 | 0000..01 |
|  |  |  | n−1 |

— not used in this mode

MODE = 2 ($E_{max}$ = 3)

| $E_Y$ | Error Bit | Sign Bit | Rest of Code |
|---|---|---|---|
| −n | 1 | 0 | 0000..01 |
|  |  |  | n−2 |
| . | 1 | 0 | . |
| . | 1 | 0 | . |
| . | 1 | 0 | . |
| −5 | 1 | 0 | 001 |
| −4 | 1 | 0 | 01 |
| −3 | 1 | 0 | 1 |
| −2 | 0 | 0 | 1 |
| −1 | 0 | 0 | 0 |
| 0 | — | — | — |
| 1 | 0 | 1 | 0 |
| 2 | 0 | 1 | 1 |
| 3 | 1 | 1 | 1 |
| 4 | 1 | 1 | 01 |
| 5 | 1 | 1 | 001 |
| . | 1 | 1 | . |
| . | 1 | 1 | . |
| . | 1 | 1 | . |
| n | 1 | 1 | 0000..01 |
|  |  |  | n−2 |

— not used in this mode

MODE = 3 ($E_{max}$ > 3)

| $E_Y$ | Error Bit | Sign Bit | Rest of Code |
|---|---|---|---|
| −n | 1 | 0 | 0000..01 |
|  |  |  | n−4 |
| . | 1 | 0 | . |
| . | 1 | 0 | . |
| . | 1 | 0 | . |
| . | 1 | 0 | . |
| −7 | 1 | 0 | 001 |
| −6 | 1 | 0 | 01 |
| −5 | 1 | 0 | 1 |
| −4 | 0 | 0 | 11 |
| −3 | 0 | 0 | 10 |
| −2 | 0 | 0 | 01 |
| −1 | 0 | 0 | 00 |
| 0 | — | — | — |
| 1 | 0 | 1 | 00 |
| 2 | 0 | 1 | 01 |
| 3 | 0 | 1 | 10 |
| 4 | 0 | 1 | 11 |
| 5 | 1 | 1 | 1 |
| 6 | 1 | 1 | 01 |
| 7 | 1 | 1 | 001 |
| . | 1 | 1 | . |
| . | 1 | 1 | . |
| . | 1 | 1 | . |
| n | 1 | 1 | 0000..01 |
|  |  |  | n−4 |

— not used in this mode

Register 36 is for the purpose of delay so that the value $E_Y$ determined in the Encoder Logic block 30 will become the value $E_A$ for the evaluation of the next pel and also for storage for use on the next line.

Figure 10:
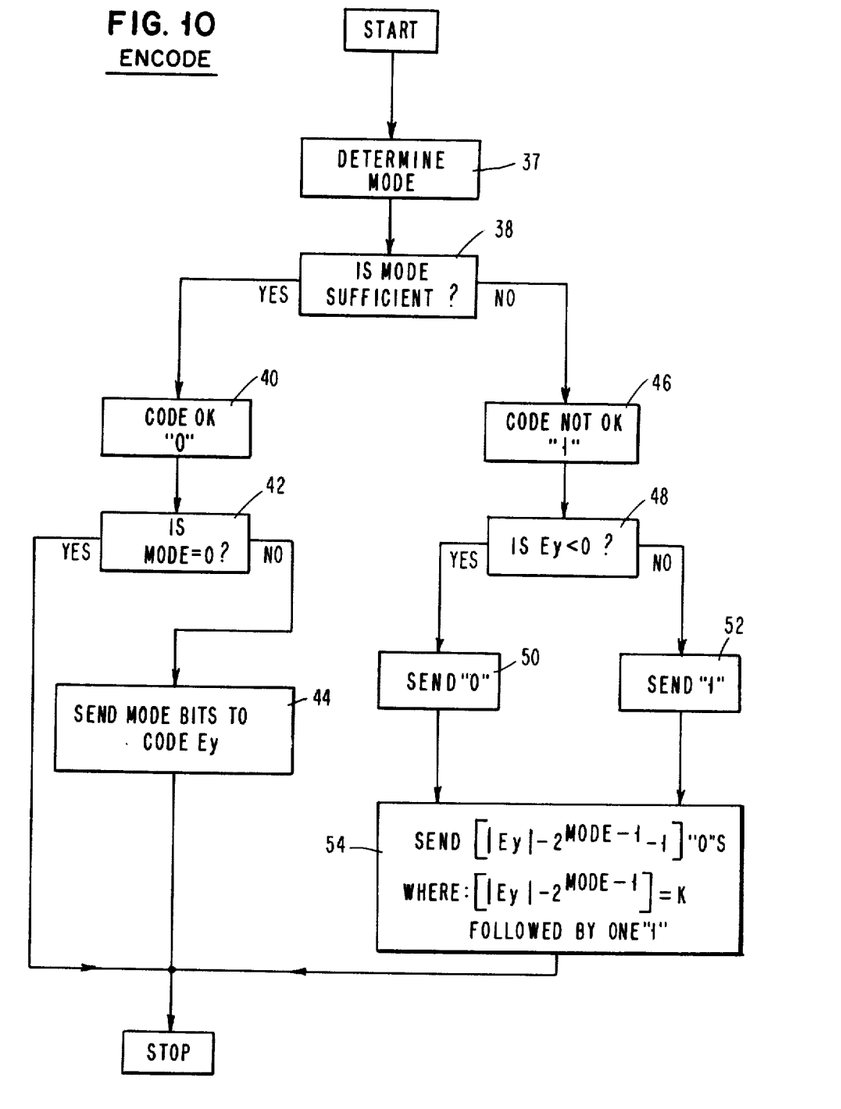
FIG. 10 comprises a flow chart of the actual cache generation performed by the "Encoder" block 34 of FIG. 6.

Referring to the flowchart of FIG. 10, the operations which occur within the Encode block 34 are clearly illustrated. It should be noted that block 34 is supplied with the value $E_Y$ which must be encoded and the $E_{max}$ for prediction of the allowed range specified by MODE which may or may not be sufficient for encoding the pel. Accordingly, the first step is illustrated in block 37 where a MODE determination is made, utilizing $E_{max}$. In block 38 a determination is made as to whether or not the MODE is sufficient (contains enough bits) for encoding $E_Y$. Assuming that it is sufficient, the operation continues to block 40 which generates an error bit of 0 and proceeds to block 42 where the value of MODE is examined. If "0" it is an indication that $E_Y$ is zero and is not transmitted and so the encoding operation is completed. If, on the other hand, the computed MODE were not "0" the system would branch to block 44 which would first cause a sign bit to be generated followed by the absolute value of $E_Y$ in binary form. Upon the completion of this operation, the encoding process for that pixel would be completed.

Returning now to the condition where the MODE was found to be insufficient for sending $E_Y$, the system would branch to block 46 which produces an error bit of "1". The system then proceeds to block 48 where a determination is made as to whether the value of $E_Y$ is positive or negative. Negative assigned bit of 0 is sent via block 50 and positive assigned bit of 1 is sent via block 52. In either case, the system proceeds to block 54 where the actual code is generated representing the appropriate value for $E_Y$. An example of the code generated for the present embodiment is shown in TABLE III as explained previously. This code may be functionally defined by the formula shown in block 54. It may thus be seen that the code may be generated by straightforward logic circuitry or conversely, may be obtained via table lookup as indicated in TABLE V. Upon completion of block 54 the coding function is completed for that pel and the system is ready to proceed with the next pel.

This completes the description of the operation of the specific hardware utilized in the present preferred embodiment of the encoding operation.

Subsequently, a specific example of the operation of the present data compression system will be set forth in tabular form which illustrates the various stages of computation and the resultant code which would appear at the output of the encoding operation. Similarly, the decoding operation is tabulated using as input the same encoded message and producing a decompressed message stream at its output.

Figure 7:
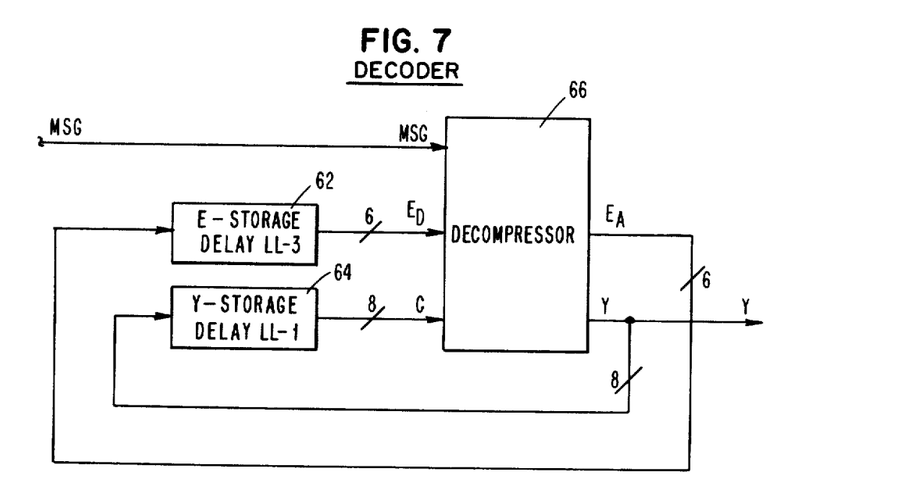
FIG. 7 comprises a functional block diagram of a Decoder suitable for use with the present system.
Figure 8:
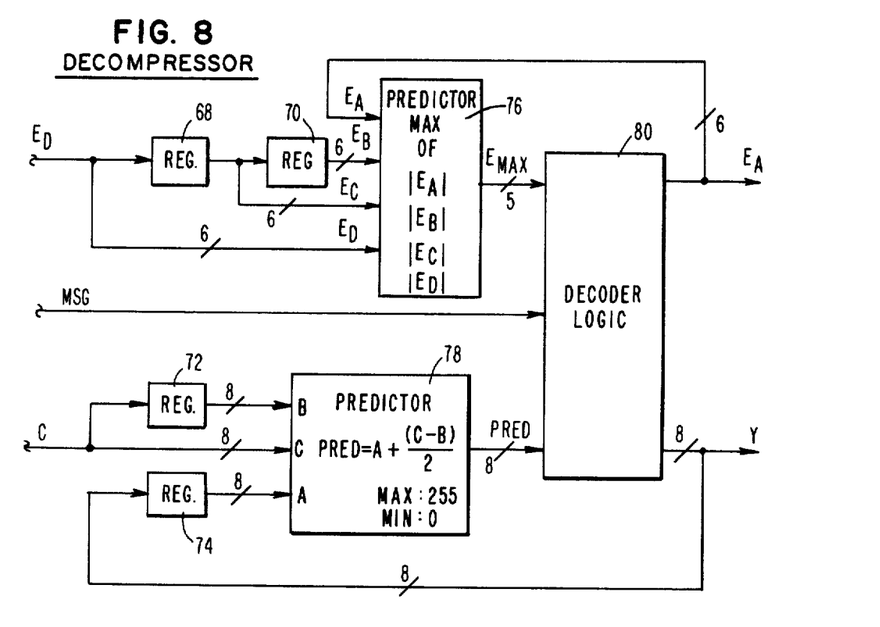
FIG. 8 comprises a functional block diagram of the Decompressor block of FIG. 7.
Figure 9:
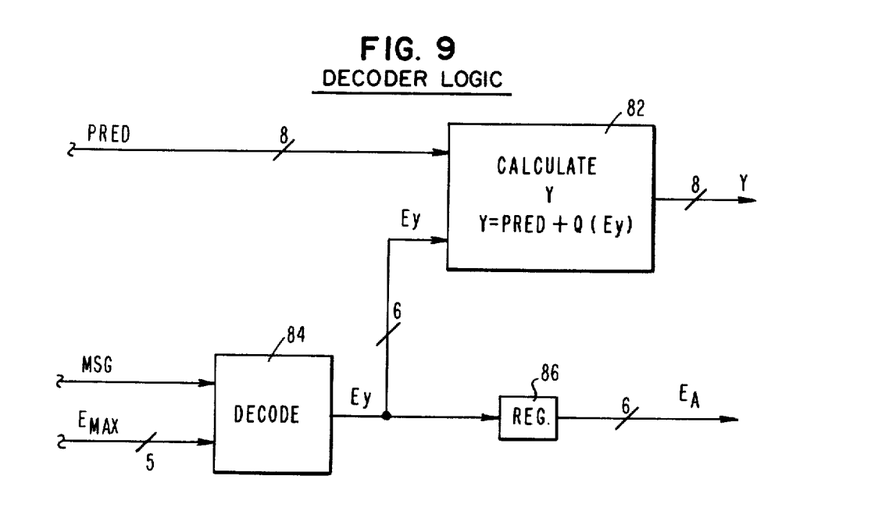
FIG. 9 comprises a functional block diagram of the Decoder Logic block of the Decompressor shown in FIG. 8.

Referring briefly now to FIGS. 7, 8 and 9, the hardware necessary to produce the decoding function will be briefly discussed. As all of the operations in the Decoder are substantially the same as those which occur in the Encoder the operation of the Decoder will essentially be obvious once the operation of the encoder is understood. Referring to FIG. 7 it will be noted that the Decoder very much resembles the Encoder with the exception of the elimination of a Scanner.

The decompressor receives as its input the compressed or encoded message stream (MSG) and includes the two storage elements 62 and 64 which are the equivalent of the Storage elements 12 and 14 in the Encoder (FIG. 4). As indicated in the blocks the storage element 62 has a delay equal to a line length minus three pels whereas the storage unit 64 has a delay of a line length minus one pel. The values $E_D$ and Y are the same values for a given pel as those computed in the Encoder. It should be reiterated that the series of gray scale values Y produced by the Decoder, while an approximation of the original gray scale values X are, as will be remembered, not precisely the same. The operations of decoding insofar as the prediction first of the value PRED and secondly of the range of $E_Y$ from $E_{max}$ are precisely the same operations in the Decoder as in the Encoder.

Thus, referring to FIG. 8 which shows the details of the Decompressor it will be noted that the registers 68, 70, 72 and 74 operate in precisely the same way as the registers 18, 20, 22 and 24 in FIG. 5 of the Compressor. They, in fact, delay their input by one pel's processing time to provide the value $E_B$, $E_C$, B and A respectively. The input $E_A$ is produced directly from the output of the Decoder Logic 80 as in the Compressor. C and $E_D$ come from the storage units 12 and 14.

Blocks 76 and 78 in the Decompressor operate in exactly the same way as blocks 26 and 28 in the Compressor. Utilizing the enumerated inputs they produce respectively the values for $E_{max}$ and PRED. These two values are transmitted directly to the Decoder Logic 80 and the third input to the Decoder logic is the message MSG. It is noted that the values of $E_{max}$ and PRED are computed from history pels and at this point, no input from the message stream is required. The two blocks 76 and 78, are identical to blocks 26 and 28 in the Encoder and would conventionally comprise small micro processors driven, for example, by a read only memory. The Decoder Logic is shown in greater detail in FIG. 9 and is quite similar to the Encoder Logic in FIG. 6. The Decode block 84 receives, as its input, the message MSG and the value of $E_{max}$ computed in FIG. 8. The Decoder must first look at the error bit to determine if it is a 1 or a 0. If it is a 0 it means that the prediction of the number of bits for encoding $E_Y$ was sufficient. In order to know how many bits were allotted for this purpose, it must determine the MODE for the particular pel being decoded. Once it has determined the MODE the Decoder will decode the sign bit and then extract the proper number of additional bits from the message stream allotted for encoding the value $E_Y$, and transmit same to block 82 where the actual value of Y is calculated using $E_Y$ and PRED.

However, if the Decode block 84 determines that the error bit is 1 a different decoding mode must be used to compute the proper value of $E_Y$. This will be remembered from the previous discussion. In this case, the encoding of $E_Y$ will be a predetermined number of 0's followed by a 1 which will result in a value for $E_Y$ suitable for the final calculation of Y in block 82. Decoding the actual value of $E_Y$ depending on whether the error bit is set for 1 or a 0, may again be either by a simple table look-up mechanism or through relatively straight-forward logic circuitry as described previously.

The decoding tables, in the case of a table look-up would be identical to the encoding tables of Table II and Table V except that entry would be on the opposite side of the tables. The output $E_Y$ from the Decode block 84, as stated previously, forms one input to block 82 and also passes through register 86 which, in effect, delays the value one pel position so that it becomes the value $E_A$ to be utilized in decoding the next pel.

Block 82 performs the relatively straightforward operation of producing the proper value of Y from the value PRED, computed in the logic in FIG. 8, and the value of $E_Y$ represented in straightforward binary form produced by block 84 described previously. The value $E_Y$ is transmitted to block 82 in binary form and as described in detail previously, its value is directly translatable into Q. This is illustrated in the following Table VI.

TABLE VI

| $E_Y$ | $Q(E_Y)$ |
|---|---|
| 0 | 0 |
| ±1 | ±2 |
| ±2 | ±5 |
| ±3 | ±8 |
| ±4 | ±13 |
| ±5 | ±20 |
| ±6 | ±27 |
| ±7 | ±36 |
| ±8 | ±47 |
| ±9 | ±59 |
| ±10 | ±72 |
| ±11 | ±86 |
| ±12 | ±100 |

Table VI defines the mappings of various $E_Y$ values to a specific member of a typical quantization characteristic Q. Thus, for example, if the decoded value of $E_Y$ were +5 this would point to a quantization value of +20 in Table VI. The value of 20 would thus be added to whatever value had been previously determined for PRED. If the value of PRED were, for example, 132, the value of Y would be 132 plus 20 or 152. It should be specifically noted that the values or mappings between the quantized error E and the quantization characteristic Q are significantly different from those shown in FIG. 3. This was done primarily to show that different quantization characteristics could be used with different systems based on the statistical characteristics of the system and the type of images encountered. It would, of course, be obvious, that precisely the same quantization characteristic and mappings must exist for both the encoding and decoding operations for proper decoding.

As is apparent from FIG. 9 the output of block 82 is the decoded or decompressed pel value Y.

It should also be noted in the previous description that if the MODE determination performed in block 84 had produced a MODE of 0 subsequent to determining that the error bit was set to a "0". A "0" appearing on this $E_Y$ line would have indicated to block 82 that the value of Q pointed to by $E_Y$ was zero and in this particular case Y equals PRED.

Figure 11:
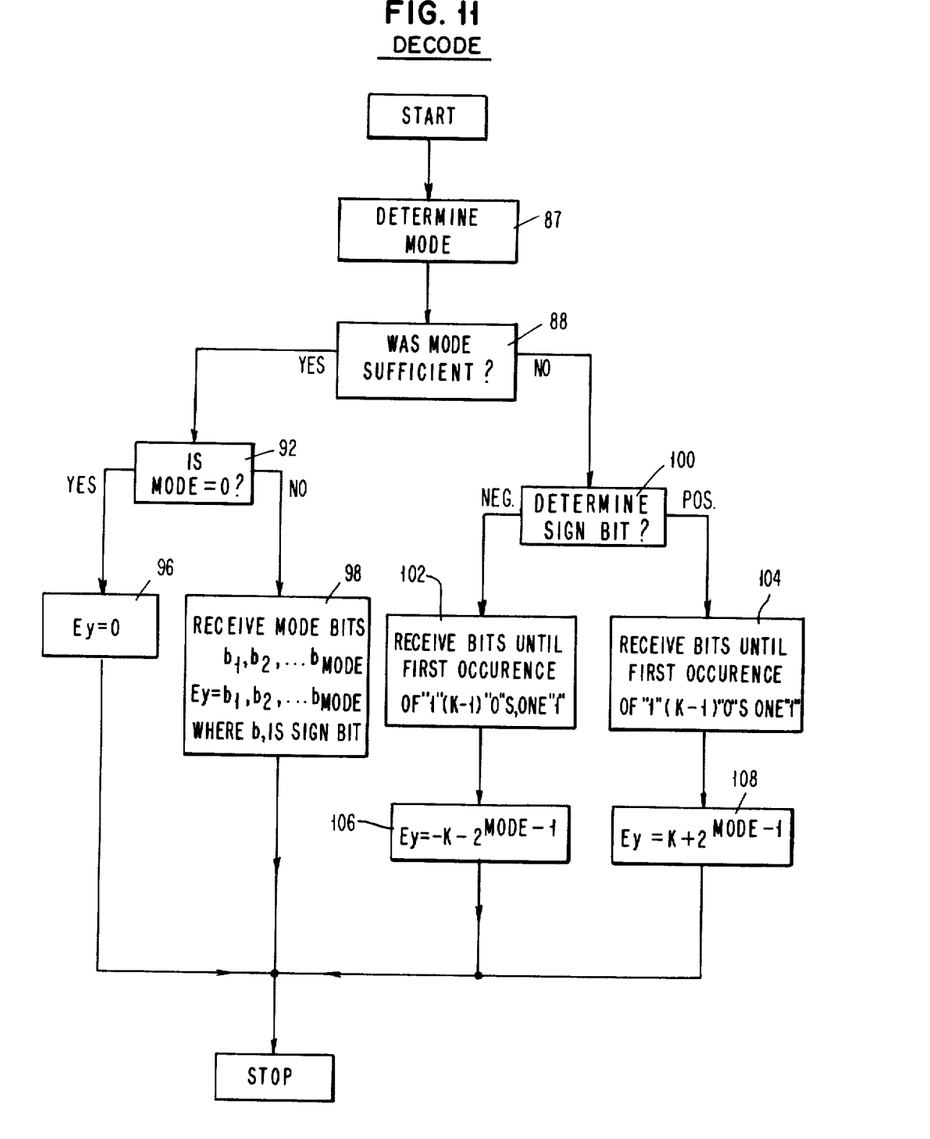
FIG. 11 comprises a flow chart illustrating the decoding operations performed in the Decoder block 84 of FIG. 9.

Referring now to FIG. 11 it will be noted that this flowchart is very similar to the flowchart of FIG. 10. The flowchart of FIG. 11 specifies the particular operations or functions which occur in the Decode block 84. After determining the MODE in block 87 in a way identical to block 37 in FIG. 10 the next operation is performed in block 88 wherein the error bit is examined to see if the range predicted from the MODE is sufficient. If the error bit indicates that it is not sufficient, the system will proceed to block 100. If, on the other hand, it is determined that the MODE is sufficient, then Block 92 determines whether the value of MODE equals 0. If this is the case, the system proceeds to block 96 wherein the value $E_Y=0$ is produced and sent to block 82 in FIG. 9 as described previously. If MODE is not 0 the system proceeds to block 98 which utilizes the computed value of MODE to decode the value of $E_Y$ as extracted from the message in straightforward binary form, of a code length specifically indicated by the evaluation at MODE. The sign bit must of course, also be extracted from the message stream and becomes part of the value $E_Y$ transmitted to the computational block 82.

Returning now to block 88 where a determination was made that the MODE was not sufficient and wherein the system proceeds to block 100, the sign bit is first decoded, and depending on the value of the sign bit, the system proceeds to block 102 or to 104 which are essentially identical insofar as computing the absolute value of $E_Y$. As will be remembered in the code format for $E_Y$ where the mode was not sufficient, a simple variable length code is utilized wherein the number of 0's preceding a 1 are counted and this directly maps into a value $E_Y$. For each MODE $|E_Y|$ is one greater than the number of 0's preceding the 1 (as indicated in block 102) plus $2^{MODE-1}$. Blocks 106 and 108 receive the output from blocks 102 and 104 respectively and convert it into a signed 6 bit binary code representing the proper value for $E_Y$ which is then transmitted to the computational block 82 as appropriate.

The above description of FIGS. 7, 8, 9 and 11 completes the description of the decoding or decompression operation. Utilizing the teachings the present invention coding rate of approximately 1½ bits per pel has been achieved from an original 8 bits per pel gray scale images. It will, of course, be understood that the resultant decoded quantized values representing a string of Y approximations are not precisely equal to the original stream of X values. However, experience utilizing a wide variety of images has produced decoded images which are virtually imperceptible from the original images represented by the stream of X values.

Before proceeding with the description of a further aspect of the invention wherein the above encoding and decoding operations are subjected to an arithmetic encoding and decoding operation an example of the operation of the present system will be briefly set forth in Table VII.

It is believed that the table is essentially self-explanatory, however following comments will explain certain significant points. The example looks at pel positions 21 through 29 as indicated on Table VIIA top line. These same pel columns apply throughout the table. The actual gray scale values X for each pel are shown in decimal form for simplicity as are the values for A, B, C and Y and the quantized errors $E_Y$, $E_A$, $E_B$, $E_C$ and $E_D$. That last four lines on Table VIIB, which evaluate the "error" "sign", and $E_Y$ (rest of code) code are shown in binary form. It will also be noted that these three message segments are concatenated to form the message (MSG) code in each case.

The final decoded gray scale output stream Y is shown in the middle of Table VIID. It will be noted that it is identical to the values for Y computed in the Compressor as shown in Table VIIB.

TABLE VIIA

| Example of Encoding Procedure | | | | | | | | | |
|---|---|---|---|---|---|---|---|---|---|
| Pel Column | 21 | 22 | 23 | 24 | 25 | 26 | 27 | 28 | 29 |
| History E's | 0 | 0 | 0 | −1 | 1 | −2 | 2 | 3 | 8 |
| History Y's | 65 | 67 | 69 | 69 | 75 | 79 | 79 | 87 | .. |
| X | 68 | 68 | 67 | 68 | 69 | 69 | 80 | 110 | .. |
| Inputs to Compressor | | | | | | | | | |
| $E_D$ | 0 | 0 | −1 | 1 | −2 | 2 | 3 | 8 | |
| C | 65 | 67 | 69 | 69 | 75 | 79 | 79 | 87 | |
| X | 68 | 68 | 67 | 68 | 69 | 69 | 80 | 110 | .. |
| Max of $\|E_A\|$, $\|E_B\|$, $\|E_C\|$, $\|E_D\|$ | | | | | | | | | |
| $E_D$ | 0 | 0 | −1 | 1 | −2 | 2 | 3 | 8 | |
| $E_C$ | 0 | 0 | 0 | −1 | 1 | −2 | 2 | 3 | |
| $E_B$ | 0 | 0 | 0 | 0 | −1 | 1 | −2 | 2 | |
| $E_A$ | 0 | 0 | 0 | −1 | 0 | −1 | −2 | 4 | |
| $E_{max}$ | 0 | 0 | 1 | 1 | 2 | 2 | 3 | 8 | |
| Predictor PRED = A + (C−B)/2 | | | | | | | | | |
| C | 65 | 67 | 69 | 69 | 75 | 79 | 79 | 87 | |
| B | 67 | 65 | 67 | 69 | 69 | 75 | 79 | 79 | |
| A | 68 | 69 | 70 | 69 | 69 | 70 | 68 | 81 | |
| PRED | 69 | 70 | 71 | 69 | 72 | 73 | 68 | 85 | |

TABLE VIIB

| Part of Encode Logic | | | | | | | | |
|---|---|---|---|---|---|---|---|---|
| $E_{max}$ | 0 | 0 | 1 | 1 | 2 | 2 | 3 | 8 |
| X | 68 | 68 | 67 | 68 | 69 | 69 | 80 | 110 |
| PRED | 69 | 70 | 71 | 69 | 72 | 73 | 68 | 85 |
| Q | 0 | 0 | −2 | 0 | −2 | −5 | 13 | 27 |
| Y | 69 | 70 | 69 | 69 | 70 | 68 | 81 | 112 |
| $E_Y$ | 0 | 0 | −1 | 0 | −1 | −2 | 4 | 6 |
| Encode Block | | | | | | | | |
| $E_Y$ | 0 | 0 | −1 | 0 | −1 | −2 | 4 | 6 |
| $E_{max}$ | 0 | 0 | 1 | 1 | 2 | 2 | 3 | 8 |
| MODE | 0 | 0 | 0 | 0 | 1 | 1 | 2 | 3 |
| Error Bit | 0 | 0 | 1 | 0 | 0 | 1 | 0 | 1 |
| Sign Bit | | | 0 | 1 | 0 | 0 | 1 | 1 |
| Rest of Code | | | 1 | 1 | 1 | 1 | 01 | 01 |
| MSG | 0 | 0 | 101 | 011 | 001 | 101 | 0101 | 1101 |

TABLE VII C

Example of Decoding Procedure

| Pel Column... | 21 | 22 | 23 | 24 | 25 | 26 | 27 | 28 | 29 | ... |
|---|---|---|---|---|---|---|---|---|---|---|
| History E's | 0 | 0 | 0 | −1 | 1 | −2 | 2 | 3 | 8 | |
| History Y's | 65 | 67 | 69 | 69 | 75 | 79 | 79 | 87 | .. | |
| Inputs to Decompressor | | | | | | | | | | |
| $E_D$ | 0 | 0 | −1 | 1 | −2 | 2 | 3 | 8 | | |
| C | 65 | 67 | 69 | 69 | 75 | 79 | 79 | 87 | | |
| MSG | 0 | 0 | 101 | 011 | 001 | 101 | 0101 | 1101 | | |
| Max of $\|E_A\|, \|E_B\|, \|E_C\|, \|E_D\|$ | | | | | | | | | | |
| $E_D$ | 0 | 0 | −1 | 1 | −2 | 2 | 3 | 8 | | |
| $E_C$ | 0 | 0 | 0 | −1 | 1 | −2 | 2 | 3 | | |
| $E_B$ | 0 | 0 | 0 | 0 | −1 | 1 | −2 | 2 | | |
| $E_A$ | 0 | 0 | 0 | −1 | 1 | −1 | −2 | 4 | | |
| $E_{max}$ | 0 | 0 | 1 | 1 | 2 | 2 | 3 | 8 | | |

TABLE VII D

| Predictor PRED = A + (C−B)/2 | | | | | | | | |
|---|---|---|---|---|---|---|---|---|
| C | 65 | 67 | 69 | 69 | 75 | 79 | 79 | 87 |
| B | 67 | 65 | 67 | 69 | 69 | 75 | 79 | 79 |
| A | 68 | 69 | 70 | 69 | 69 | 70 | 68 | 81 |
| PRED | 69 | 70 | 71 | 69 | 72 | 73 | 68 | 85 |
| Part of Decode Logic | | | | | | | | |
| $E_{max}$ | 0 | 0 | 1 | 1 | 2 | 2 | 3 | 8 |
| PRED | 69 | 70 | 71 | 69 | 72 | 73 | 68 | 85 |
| $E_Y$ | 0 | 0 | −1 | 0 | −1 | −2 | 4 | 6 |
| Q | 0 | 0 | −2 | 0 | −2 | −5 | 13 | 27 |
| Y | 69 | 70 | 69 | 69 | 70 | 68 | 81 | 112 |
| Decode Block | | | | | | | | |
| $E_Y$ | 0 | 0 | −1 | 0 | −1 | −2 | 4 | 6 |
| $E_{max}$ | 0 | 0 | 1 | 1 | 2 | 2 | 3 | 8 |
| MODE | 0 | 0 | 0 | 0 | 1 | 1 | 2 | 3 |
| Error Bit | 0 | 0 | 1 | 0 | 0 | 1 | 0 | 1 |
| Sign Bit | | | 0 | 1 | 0 | 0 | 1 | 1 |
| Rest of Code | | | 1 | 1 | 1 | 1 | 01 | 01 |

For arithmetic encoding all of the functional hardware diagrams of FIGS. 4 through 9 are unchanged. The functional changes would occur entirely within the Encode and Decode blocks 34 and 84. The required changes are explained subsequently with respect to FIGS. 10 and 11.

Arithmetic coding requires a probability for a bit to be "0" and the actual bit (0 or 1) as input to the coding process. These probabilities need not be fixed but can be different for the coding of each bit. However, the encoder and decoder must determine the same probability before encoding or decoding.

In FIG. 10 blocks 40 and 46 code OK or NOT OK respectively by sending a "0" or a "1". For the particular embodiment of adaptive arithmetic coding disclosed the probability that the error bit is 0 is determined separately for each mode from the cumulative number of "0" error bits in that mode divided by the total number of times that mode was encountered. The cumulative counts for "0" and total are initialized to 1 and 2 respectively at the start of each image. For the sign bits and rest of code bits a fixed probability of ½ was chosen for simplicity. The probability model disclosed here is to be considered as illustrative only. Any other model for adaptively or non-adaptively determining the probabilities could be used provided only the past information known to both encoder and decoder is used.

In FIG. 11 the block 88 determines whether the mode was sufficient by arithmetically decoding using MODE to determine the identical probability that the encoder had used. Blocks 98, 100, 102 and 104 use a fixed probability of ½ to arithmetically decode the bits.

Two further references disclosing the details of an arithmetic coding system using predetermined probabilities are set forth in (1) an article by Rubin, entitled "Arithmetic Stream Coding Using Fixed Precision Registers", page 672, IEEE Transactions on Information Theory, Nov. 1979, Vol. IT-25, No. 6, and (2) an IBM Research Report No. RJ2707, entitled "Compression of Black-White Images with Binary Arithmetic Coding", by Langdon et al, available from the IBM Research Center Library in Yorktown Heights, N.Y.

INDUSTRIAL APPLICABILITY

As stated previously in the specification the present method and apparatus for producing a highly compresed code representative of gray scale image data has many applications in the data processing field. Communication line rental charges make the use of gray scale video transmission virtually impractical due to the extremely large volumes of data necessary. The use of such a data compression scheme as disclosed herein makes particularly for tele-conferencing practical high quality video tele-communications.

Similarly, the storage of video image data is classically very expensive and due to the extremely large volumes of data usually involved and the requisite storage requirements very few systems attempt to store such video data. The present data compression method and apparatus facilitates the compression and the storage of video data with subsequent decompression possible at any time in the future. There is accordingly a significant decrease in the storage capacities required.

Adding a step of the Arithmetic Encoding and Decoding with the present adaptive DPCM coding method produces further significant savings on the order of ¼ bit/pel. Thus the additional concept of arithmetic encoding and decoding even further enhances the contribution of the present invention to the video communication field.

This scheme is also applicable to the transmission of high quality photographs with facsimile equipment.

As stated previously, arithmetic coding has been known in the art for some years, however, its application to further enhance the previously encoded adaptive DPCM code stream is due to the unique characteristics of the "error bit" pattern produced by the present adaptive DPCM system.

Having thus described our invention, what we claim as new, and desire to secure by Letters Patent is:

1. A method for compressing gray scale image data comprising:
   predicting the gray scale value of a current pel which is to be processed, utilizing the values of previously processed pels.

predicting a range of values, by a smoothness determination, which should suffice for coding the current pel's quantized error, determining the minimum range of values which are actually needed to accurately encode the quantized error for the pel, producing a first special purpose code bit when the predicted range of values for coding the quantized error is sufficient and a different bit when it is insufficient, and generating a code word for indicating the required quantization value for modification of the predicted pel value.

2. A data compression method as set forth in claim 1, including determining that no quantization of the predicted gray scale value is necessary and producing said first special purpose code bit in response thereto and producing no quantized error code indication of a quantization correction.

3. A method for compressing gray scale image data as set forth in claim 2 including further compacting the resultant code stream by arithmetically encoding said special purpose bits and the quantized error bits.

4. A method for compressing gray scale image data which comprises the steps of:

predicting the gray scale value of a current pel which is to be processed, utilizing the generated gray scale values of previously processed pels, predicting the number of bits which should suffice for encoding the quantized error for correcting the predicted gray scale pel value to approximately the true value of the current pel, determining the minimum number of bits which are actually needed to encode the quantized error, producing a first, special purpose code bit when the predicted number of bits for encoding the quantized error is sufficient and a different bit when it is insufficient, and generating the indicated variable length code for said quantized error.

5. A method for compressing gray scale image data as set forth in claim 4 including determining that no quantized error is necessary for coding a particular pel, producing said first special purpose code bit in response thereto, and proceeding to evaluate the next pel to be transmitted without generating a quantized error code for said previous pel.

6. A data compression system for compressing gray scale image data which comprises first prediction means for predicting the gray scale value of a current pel which is to be transmitted, utilizing the values of previously transmitted pels.

second prediction means for predicting the code which should suffice for transmitting the quantized error for correcting the predicted pel gray scale value to approximately the true value of said pel, means for determining the code which is actually needed to encode the quantized error, means for producing a first special purpose code bit when the predicted range of codes for encoding the quantized error is sufficient and a different bit when it is insufficient, and means for generating a first quantized error code when the predicted range of codes is sufficient and a second code when it is insufficient.

7. An image data compression system as set forth in claim 6 wherein said second prediction means includes means for determining what quantized error is necessary to map to the required quantization value of a predetermined quantization characteristic in order to generate the best possible coded approximation of the gray scale value of the current pel.

8. A data compression system as set forth in claim 6, said means for predicting the gray scale value of the pel including means for storing the generated gray scale values for a plurality of predetermined history pels produced by the system.

9. A data compression system as set forth in claim 8 wherein said means for predicting the code which should suffice for generating the quantized error includes means for storing the quantized error which was actually generated for said plurality of pre-determined history pels.

10. A data compresssion system as set forth in claim 9 wherein said means further includes microprocessor means for selecting the largest of the quantized error signals of said history pels and an indication of the range of codes which should suffice for encoding the quantized error for the current pel.

11. A system for compressing and decompressing gray scale image data which comprises, compression means including first prediction means for predicting the gray scale value of a current pel which is to be transmitted, utilizing the values of previously transmitted adjacent pels, second prediction means for predicting the code which should suffice for transmitting the quantized error for correcting the predicted pel gray scale value to approximately the true value of said pel, means for determining the code which is actually needed to encode the quantized error, means for producing a first special purpose code bit when the predicted range of codes for emcoding the quantized error is sufficient and a different bit when it is insufficient, and means for generating a first quantized error code when the predicted range of codes is sufficient and a second code when it is insufficient, and means for decompressing said compressed code comprising a first and second prediction means substantially identical to those in said compression means.

means responsive to the output of said first and second prediction means for decoding the quantized error from the compressed message stream, means for producing other required quantization value from the decoded quantized error and, means for generating the decompressed gray scale value Y from the output of said first prediction means and the derived quantization value.

12. A data compression and decompression system as set forth in claim 11, said means for predicting the gray scale value of the pel including means for storing the generated gray scale values for a plurality of predetermined history pels produced by the system.

13. A data compression and decompression system as set forth in claim 12 wherein said second prediction means for predicting the code which should suffice for generating the quantized error includes means for storing the quantized error which was actually generated for said plurality of pre-determined history pels.

14. A data compression and decompression system as set forth in claim 13 wherein said second prediction means includes means for predicting the number of code bits for generating the proper quantized error code for the current pel, means for determining the actual number of bits necessary to generate the proper quantized error code and, means for predicting said first special purpose bit when the predicted number of bits is adequate to encode the proper quantized error whereby a continuously adaptable fixed length quantized error code is produced.

15. A data compression and decompression system as set forth in claim 14 wherein said means for operating said second quantized error code includes means for generating a variable length compression code representative of the required quantized error.

16. A data compression and decompression system as set forth in claim 15 wherein said second prediction means further includes microprocessor means for selecting the largest of the quantized error signals of said history pels and for determining as a function thereof the number of bits which should suffice for encoding the quantized error for the current pel.

17. A method for compressing gray scale image data as set forth in claim 3 including arithmetically coding the special purpose bits using a first probability model and arithmetically coding any quantized error bits using a second probability model.

18. A method for compressing gray scale image data as set forth in claim 17 including coding said special purpose bits utilizing an adaptive probability determination involving determining the MODE related to the particular special purpose bit and the total image history up to that point where the same MODE was used.

19. A data compression and decompression system as set forth in claim 16 including means for arithmetically coding and decoding the resultant message comprising the special purpose bits, and bits coding the quantized error.

20. A data compression and decompression system as set forth in claim 19 wherein said arithmetic coding and decoding means utilizes a first probability model for coding and decoding the special purpose bits and a second model for coding and decoding the quantized error bits.

21. A data compression and decompression system as set forth in claim 20 wherein said means for arithmetic coding and decoding includes means for maintaining for a particular image, the MODE history statistics for each MODE and for determining the MODE for a current pel.

* * * * *